United States Patent

Haffner

(10) Patent No.: US 7,669,176 B2
(45) Date of Patent: Feb. 23, 2010

(54) SYSTEM AND METHOD FOR SEMICONDUCTOR DEVICE FABRICATION USING MODELING

(75) Inventor: Henning Haffner, Pawling, NY (US)

(73) Assignee: Infineon Technologies AG, Neubiberg (DE)

( * ) Notice: Subject to any disclaimer, the term of this patent is extended or adjusted under 35 U.S.C. 154(b) by 185 days.

(21) Appl. No.: 11/855,887

(22) Filed: Sep. 14, 2007

(65) Prior Publication Data

US 2009/0077525 A1 Mar. 19, 2009

(51) Int. Cl.
*G06F 17/50* (2006.01)

(52) U.S. Cl. .......................................... 716/21; 716/19
(58) Field of Classification Search ................... 716/19, 716/21
See application file for complete search history.

(56) References Cited

U.S. PATENT DOCUMENTS

| | | | |
|---|---|---|---|
| 5,723,233 A | 3/1998 | Garza et al. | |
| 6,194,104 B1 | 2/2001 | Hsu | |
| 6,497,982 B1 * | 12/2002 | Wang | 430/30 |
| 6,541,167 B2 | 4/2003 | Petersen et al. | |
| 6,553,559 B2 | 4/2003 | Liebmann et al. | |
| 6,578,190 B2 | 6/2003 | Ferguson et al. | |
| 6,634,018 B2 | 10/2003 | Randall et al. | |
| 6,749,972 B2 | 6/2004 | Yu | |
| 6,904,587 B2 | 6/2005 | Tsai et al. | |
| 6,961,920 B2 | 11/2005 | Zach | |
| 7,082,588 B2 | 7/2006 | Scheffer et al. | |
| 7,120,887 B2 | 10/2006 | Bonges, III et al. | |
| 2002/0068447 A1 * | 6/2002 | Moon | 438/669 |
| 2005/0100802 A1 * | 5/2005 | Callan et al. | 430/5 |
| 2006/0188796 A1 * | 8/2006 | Word | 430/30 |
| 2007/0087571 A1 * | 4/2007 | Chang et al. | 438/706 |
| 2007/0162887 A1 * | 7/2007 | Suh et al. | 716/21 |
| 2007/0184361 A1 * | 8/2007 | Misaka | 430/5 |
| 2008/0046849 A1 * | 2/2008 | Choi | 716/6 |

* cited by examiner

*Primary Examiner*—Jack Chiang
*Assistant Examiner*—Magid Y Dimyan
(74) *Attorney, Agent, or Firm*—Slater & Matsil, L.L.P.

(57) ABSTRACT

System and method for using adjustment patterns as well as physical parameters as targets to control mask structure dimensions using optical proximity correction. A method for correcting layer patterns comprises selecting optimum sacrificial patterns, defining virtual targets from the optimum sacrificial patterns, and executing an optical proximity correction process with the virtual targets to correct layer patterns. The selecting of the optimum sacrificial patterns may be performed in a separate processing stage, thereby reducing the number of targets to be investigated during a process window optical proximity correction, thereby reducing the runtime, processing, and memory requirements.

19 Claims, 5 Drawing Sheets

SYSTEM AND METHOD FOR SEMICONDUCTOR DEVICE FABRICATION USING MODELING

TECHNICAL FIELD

The present invention relates generally to a system and method for semiconductor device fabrication, and more particularly to a system and method for using adjustment patterns as well as physical parameters as targets to control mask structure dimensions using optical proximity correction.

BACKGROUND

The accurate reproduction of patterns on the surface of a semiconductor substrate is critical to the proper fabrication of semiconductor devices. The semiconductor substrate may have undergone previous fabrication processes and may already feature layers and structures created by those fabrication processes. Improperly reproduced patterns can result in semiconductor devices that do not operate to design specifications or do not operate at all. For example, transistors can be created with improperly sized gates, conductors can be created that are short circuited or open circuited with other conductors or devices, structures can be created with wrong geometries, and so forth. Improperly reproduced patterns can reduce the yield of the fabrication process, thereby increasing the overall cost of the product. The reproduction process typically involves the use of optical lithography to reproduce the patterns onto the surface of the semiconductor substrate that is subsequently followed with a variety of processes to either subtract (for example, etch) and add (for example, deposit) materials from and to the semiconductor substrate.

However, as the dimensions of the structures making up the patterns continue to become smaller, their sizes approach (in some cases, the dimensions of the structures are smaller than) the wavelength of the light used in optical lithography, and the interference and processing effects can cause distortions and deviations in the patterns as they are reproduced onto the semiconductor substrate. In addition to the relationship between structures of the patterns and the wavelengths of the light, other factors that can cause distortion include the numerical aperture of the imaging system and the minimum pitch between structures in the pattern. The result is a reproduced pattern having a dramatically different appearance from the pattern being reproduced, also known as the intended pattern. The distortions and deviations in the reproduced pattern are dependent upon the characteristics of the pattern, such as the shape and size of the structures in the pattern, the presence of neighboring patterns and structures around the pattern, as well as the process conditions. For example, the interactions of the light with the structures making up a pattern can result in the reproduced pattern having rounded corners, bulges towards another elements, and so forth.

FIGS. 1a and 1b illustrate an exemplary pattern used in semiconductor device fabrication and a simulated reproduced pattern on a semiconductor substrate. The diagram shown in FIG. 1a illustrates a pattern 100 that is to be reproduced on a semiconductor wafer. The pattern 100 includes a plurality of structures, such as structure 105, structure 106, structure 107, structure 108, and structure 109. Ideally, there will be a one-to-one correspondence between the pattern 100 and the reproduced pattern on the semiconductor substrate.

The diagram shown in FIG. 1b illustrates a simulation of the pattern 100 as it is reproduced onto the semiconductor substrate. For example, if a threshold photoresist model is used and the dose is set to a value of 3.3 times the dose-to-clear (i.e., the dose required to develop the resist in a large clear area), then intensities of greater than or equal 0.3 will print in the photoresist. These thresholds are shown in FIG. 1b. The diagram illustrates that the more isolated regions of the pattern 100 reproduce smaller, for example, threshold 155 and threshold 156, than the more nested regions, for example, threshold 160 and threshold 161.

Optical proximity correction (OPC) is a prior art technique wherein fragments of the structures making up the pattern can be modified (moved) so that associated mask patterns no longer look like the intended pattern, but through the previously discussed interactions between the light, the photoresist, and the structures, the reproduced pattern on the semiconductor substrate made using the modified mask patterns will have an appearance that is closer to the intended pattern in appearance than the reproduced pattern made using the unmodified patterns. OPC is normally performed using computer-aided design (CAD) tools and involves the partitioning of edges of structures of a pattern into multiple fragments, which can be moved around to yield the desired reproduced pattern. The movement of the fragments can occur over multiple iterations to reach the desired reproduced pattern.

SUMMARY OF THE INVENTION

These and other problems are generally solved or circumvented, and technical advantages are generally achieved, by embodiments of a system and method for using adjustment patterns as well as physical parameters as targets to control mask structure dimensions using optical proximity correction.

In accordance with an embodiment, a method for determining optical proximity correction patterns is provided. The method includes selecting sacrificial patterns in a mask layer of a pattern for creating a semiconductor device, selecting target patterns in a target layer of the pattern, and executing an optical proximity correction process for the selected sacrificial patterns to determine a location for each sacrificial pattern. Each target pattern is less than a specified distance from a respective sacrificial pattern.

An advantage of an embodiment is that runtime and memory usage requirements may be significantly reduced. Since the runtime and memory usage requirements grow in a non-linear fashion with increasing patterns, a small investment in runtime and memory usage for sacrificial pattern selection and pre-OPC process window investigation may yield sacrificial patterns that actually may be used to define virtual targets, thereby reducing the computational effort expended during actual OPC processing.

The foregoing has outlined rather broadly the features and technical advantages of the present invention in order that the detailed description of the embodiments that follow may be better understood. Additional features and advantages of the embodiments will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The embodiments will be described in a specific context, namely a design system utilizing OPC that uses actual and virtual sacrificial patterns as well as physical parameters as targets to control mask structure dimensions, wherein optical lithography is used in the reproduction of patterns. The actual and virtual sacrificial patterns, along with the target patterns, can be collectively referred to as adjustment patterns or adjustment structures. The invention may also be applied, however, to semiconductor fabricating processes with other forms of lithography wherein the wavelength of the electromagnetic waves used to transfer the patterns approaches the dimensions of the patterns. Additionally, the invention can also be applied to semiconductor fabrication processes where an interaction between the wavelength, the numerical aperture of the imaging system and a minimum pitch between structures can cause distortions in the reproduction of mask patterns.

Figure 1A:
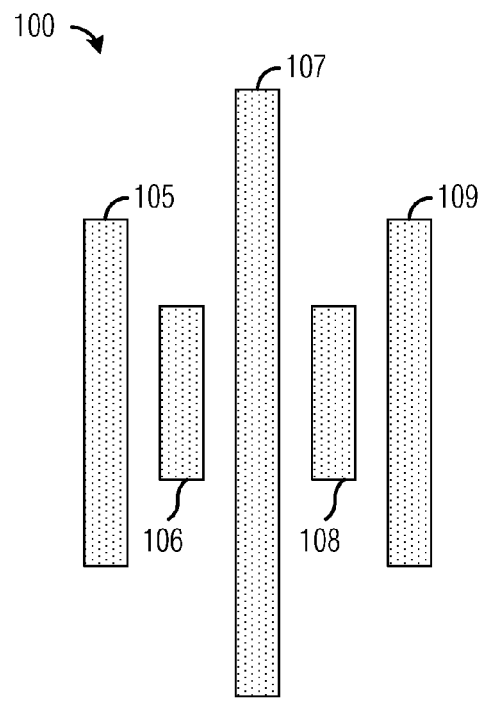
FIGS. 1a and 1b are diagrams of an exemplary pattern used in semiconductor device fabrication and a simulated reproduced pattern on a semiconductor substrate.
Figure 1B:
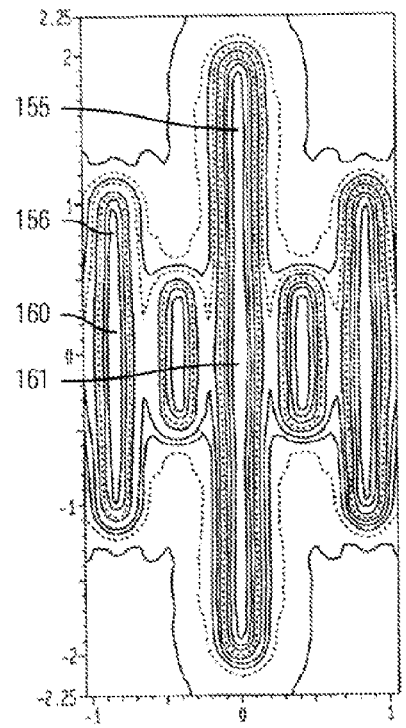
Figure 2A:
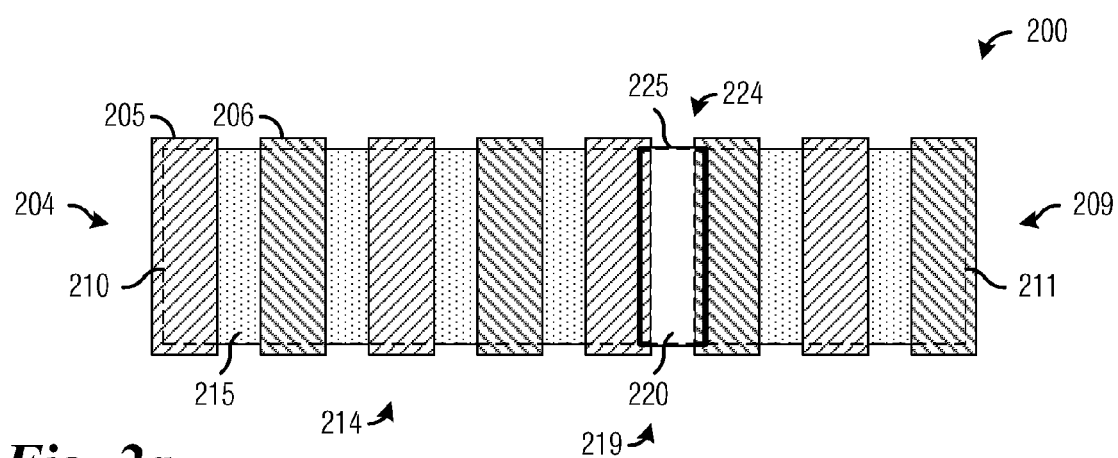
FIGS. 2a through 2f are diagrams of a composite pattern and various layers thereof.

FIGS. 2a through 2f provide diagrams illustrating a composite pattern 200 and various layers decomposed from the composite pattern 200, wherein sacrificial patterns are shown, according to a preferred embodiment of the present invention. The composite pattern 200, as shown in FIG. 2a, may be used in a dual-exposure system. Similar patterns exist for multi-exposure systems, wherein the number of exposures is different from two. The composite pattern 200 may be used to pattern a series of parallel structures on a photoresist layer of a semiconductor substrate.

Figure 2B:
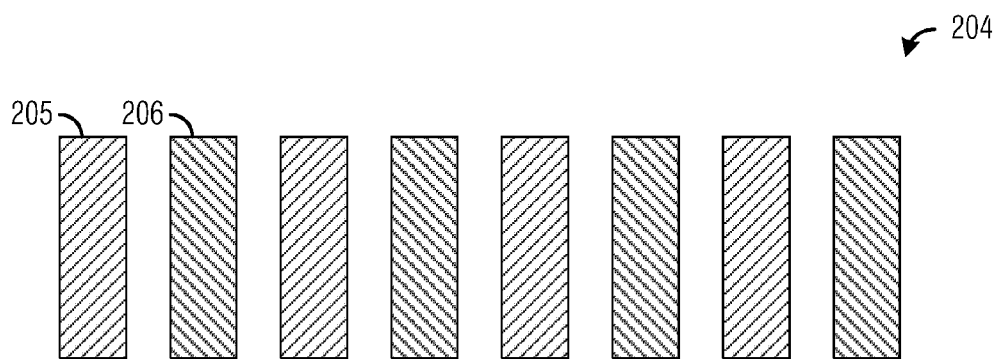

The composite pattern 200 includes a phase mask layer 204, as a shown in FIG. 2b. The phase mask layer 204 may include different structures that alter the phase of light passing through the phase mask. The phase mask layer 204 includes two different types of structures, namely structure 205 and structure 206, with each structure type altering the phase of light differently. The structure 205 and the structure 206 of the phase mask layer 204 passes light, while the remainder of the phase mask layer 204 blocks light. For example, a first structure type may pass light with a phase shift of zero (0) degrees with respect to a selected phase reference while a second structure type may pass light with a phase shift of 180 degrees with respect to the same phase reference. Although shown with two different types of structures, a phase mask layer may have more than two different types of structures.

Figure 2C:
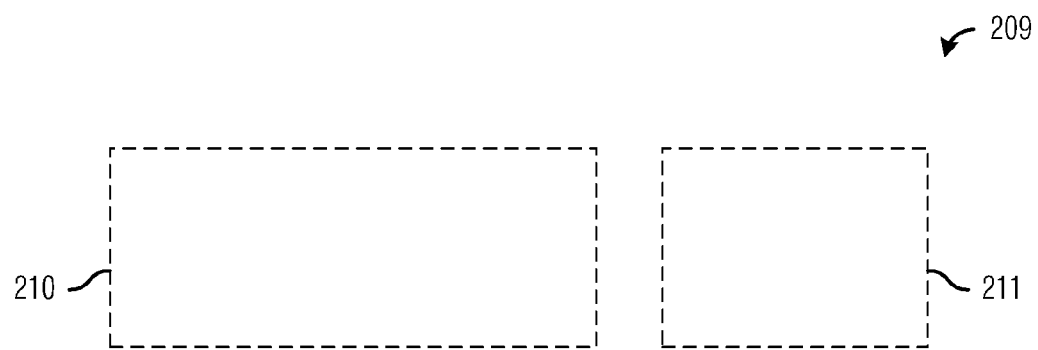

The composite pattern 200 also includes a block mask layer 209 that can be used to expose or block specific portions of the photoresist layer to or from light. The block mask layer 209, which may also be referred to as a trim mask layer, is shown in FIG. 2c. The block mask layer 209 includes two structures, structure 210 and structure 211. The structures 210 and 211 block light while the remainder of the block mask layer 209 passes light.

Figure 2D:
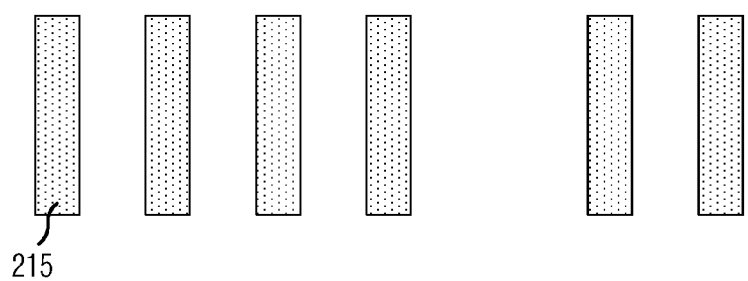

The composite pattern 200 further includes a target layer 214 as shown in FIG. 2d. The target layer 214 comprises the actual structures that will be created after the exposure of the photoresist layer to light passing through the phase mask layer 204 and the block mask layer 209. The target layer 214 includes multiple structures 215.

Figure 2E:

The composite pattern 400 also includes two additional layers. A first layer in the composite pattern 200 is a sacrificial target layer 219, which is shown in FIG. 2e. The sacrificial target layer 219 includes structures that may be used by an OPC system in its correction computations but are visible only in the intermediate exposures of the patterns making up the intended pattern and are not visible in the intended pattern. An example is structure 220.

Figure 2F:
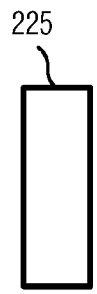

The composite pattern 200 also includes a block mask auxiliary layer 224, which is shown in FIG. 2f. The block mask auxiliary layer 224 is a layer that can have a change impact on the block mask by adding or closing openings and can be used to protect structures that are part of the block mask layer 209. The block mask auxiliary layer 224 includes structure 225, which connects structure 210 with structure 211 (of FIG. 2c) and closes an opening between the structures. Other mask layers can also have auxiliary layers.

Closer examination of the phase mask layer 204 shows that each pair of structures in the phase mask layer 204 (e.g., pairings of structure 205 and structure 206) is separated by a virtual structure, which will later become structures 215 upon subsequent exposure of the block mask layer 209. However, due to the configuration of the block mask layer 209, one of the structures will disappear once the block mask layer 209 is exposed. This structure is shown in FIGS. 2a and 2e as structure 220. Although the structure 220 does not appear in the composite pattern 200 (or the final reproduced pattern on the semiconductor substrate), the structure 220 may be used by an OPC engine in its correction computations. According to a preferred embodiment of the present invention, structures such as the structure 220 and other similar structures, referred to as actual sacrificial structures, can be used by an OPC engine in its correction computations, with an actual sacrificial structure being an actual structure of a mask layer.

As discussed here, adjustment structures can include target structures that are visible in the target layer and actual sacrificial structures that are visible only in intermediate exposures of the mask layers. Other types of adjustment structures are also possible, including sub-resolution structures, i.e., two-dimensional structures with at least one dimension that is too small to resolve on the reproduced pattern, and phantom structures that can be arbitrarily placed onto a target layer. The sub-resolution structures and the phantom structures can also be referred to as virtual sacrificial structures.

Although the sub-resolution structures are too small to resolve on the reproduced pattern, they may be present on one or more of the mask layers and can be used by the OPC system to control mask layer structure dimensions. Examples of sub-resolution structures include lines (one of two dimensions is sub-resolution) and dots (both dimensions are sub-resolution). Phantom structures are structures that are not actually present on any of the mask layers. Their presence on the target layer, however, will have an effect on the resulting structures of the mask layers when taken into account the OPC system, resulting in a difference in the output of mask layers. According to a preferred embodiment of the present invention, phantom structures can be a line or a dot or polygon placed on the target layer.

Figure 3:
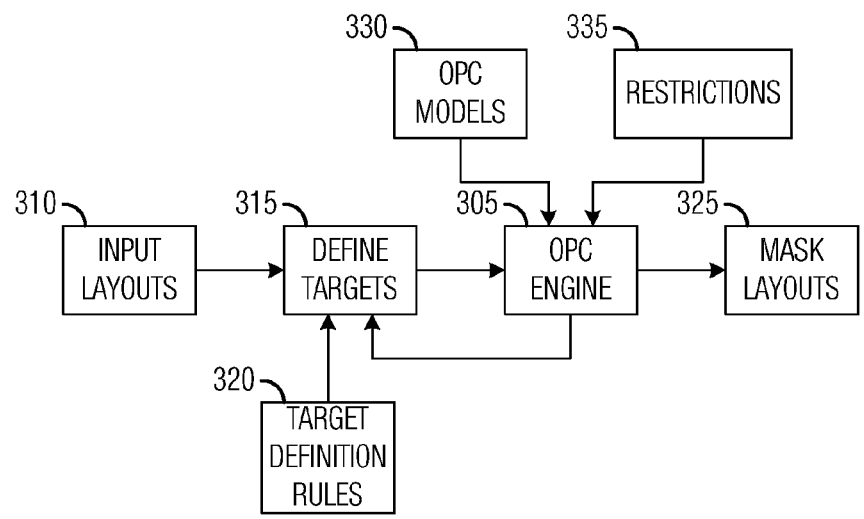
FIG. 3 is a diagram of an optical proximity correction system.

FIG. 3 illustrates an OPC system 300. The OPC system 300 includes an OPC engine 305. The OPC engine 305 can take an iterative approach wherein the OPC engine 305 moves a fragment and computes its effect on the reproduced pattern in an attempt to reach a desired result. Alternatively, or in addition, the OPC engine 305 can perform a backwards calculation, wherein the OPC engine 305 computes a change to a fragment based upon the desired result.

The OPC engine 305 may move a fragment to match reproduced patterns with the intended pattern, wherein criteria for moving the fragment can be based on simulated contours from structures in the target layer or an intermediate exposure of a mask layer, and simulated contours generated by sub-resolution structures and phantom structures (the adjustment structures). Furthermore, a criterion for moving fragments utilizing detectable physical parameters such as energy levels rather than contour shapes can also be used by the OPC engine 305 in its correction computations.

The OPC engine 305 can take as input one or more layouts 310 of the intended pattern. For example, utilizing the composite pattern 200 shown in FIG. 2a, input to the OPC engine 305 can include target layer 214, sacrificial target layer 219, phase mask layer 204, block mask layer 209, and block mask auxiliary layer 224. Other possible layers that can be input into the OPC engine 305 can include correction layers (which contain structures that are corrected by the OPC engine 305), reference layers (which can contain structures similar to sub-resolution structures but are used only in simulation), and auxiliary layers for mask layers other than the block mask layer.

The layouts 310 can then be processed to define targets by a define targets unit 315. The definition of targets by the define targets unit 315 may utilize rules and algorithms to define usable targets 320. As examples, an algorithm can be used to find edges of structures on a mask layer that will not end up as a target structure and rules can be used to define virtual thresholds and values for use with adjustment structures that affect physical parameters, and so forth. The processing of the layouts 310 to define targets can involve the definition of target dimensions for each sacrificial target with the intent of improving the process window of the resolved layers.

The define targets unit 315 may make use of the OPC engine 305 to help in the definition of targets. For example, the define targets unit 315 may select edges or fragments of edges from a mask layer(s) and then make use of the OPC engine 305 to determine if the selected edges or fragments of edges are at a location to optimize the process window of the intended pattern, or simply, optimum location. The use of the OPC engine 305 helps determine if the selected edges or fragments of edges are at an optimum location and if not, moves them until they are. This may help to reduce a total number of edges and fragments of edges that needs to be used in a final process window OPC, which may be able to significantly reduce runtime and memory requirements since the runtime and memory requirements may increase at a rate faster than linear with increased number of edges and fragments of edges to be taken into account for process window OPC consideration.

There are at least two different ways that a target can be inputted into an OPC system 300. A first way would be for the target to be a part of the input layout 310 (such as the target structures of the target layer). A second way would be for the OPC system to compute and/or derive the target from the input layout 310 (such as the sacrificial structures). Utilizing OPC models 330 and restrictions 335, the OPC engine 305 can produce layouts of mask layers 325.

Figure 4A:
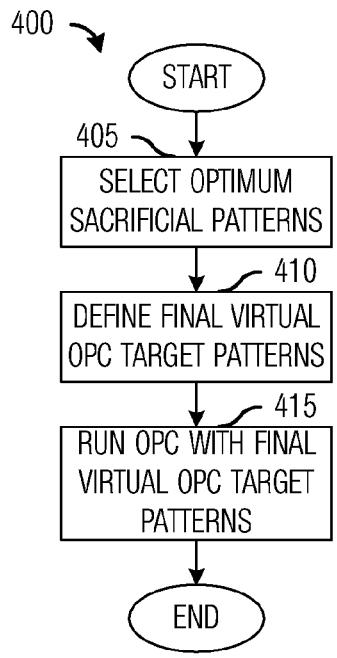
FIG. 4a is a diagram of a sequence of events in the correction of layer patterns.

FIG. 4a illustrates a sequence of events 400 in the correction of layer patterns with an OPC system utilizing sacrificial patterns, wherein several pre-processing events may help reduce runtime and processing and memory requirements. In a design's layout, there may be a large number of potential sacrificial patterns. Based on available runtime as well as processing and memory limitations, an OPC system may not be able to consider each and every sacrificial pattern in its correction of layer patterns. In some cases, the OPC system may be forced to consider only a subset of the available sacrificial patterns.

Unfortunately, not every movement of an edge of an available sacrificial pattern may have a positive impact on the correction of the mask layout for reducing tolerances on the wafer caused by process variations. If the OPC system selects a first sacrificial pattern to consider, then it may be forced to not consider a second sacrificial pattern due to computational and/or memory limitations. The impact of the sacrificial pattern may not be known until the OPC system has been able to devote valuable runtime and processing and memory resources to the sacrificial pattern.

It may be possible to partition the correction of layer patterns into multiple stages to help reduce the potentially considerable runtime, processing, and memory requirements. The correction of layer patterns 400 may begin with a selection of optimum sacrificial patterns (block 405). The runtime, processing, and memory requirements in considering a sacrificial pattern may be reduced if the OPC system considers the impact of the sacrificial pattern in its local environment rather than in a global environment. For example, given a sacrificial pattern, the OPC system may compute the impact of the sacrificial pattern on target layer patterns within a specified vicinity around the sacrificial pattern. A detailed description of the selection of optimum sacrificial patterns is provided below.

This may significantly reduce the runtime, processing, and memory requirements since the effect of moving the sacrificial pattern needs to be considered within the specified vicinity. The size of the vicinity may be varied depending on factors such as desired OPC performance, available runtime, processing, and memory resources, and so forth. In general, as the size of the vicinity is increased, the performance of the OPC may approach that of an OPC system that is capable of considering each possible sacrificial pattern. Furthermore, the limitation of the consideration of the impact of a sacrificial pattern to a specified vicinity may help to parallelize the OPC system by enabling the distribution of the needed computations across multiple processors, thereby helping to reducing the overall runtime. The selection of the optimum edge locations may be discussed in greater detail below.

Once the optimum sacrificial patterns have been determined, the correction of the layer patterns 400 may continue with a definition of final virtual OPC target patterns based on the selected optimum sacrificial patterns (block 410). Although the determination of the optimum sacrificial patterns may have reduced the total number of sacrificial patterns that may be considered, the total number of optimum sacrificial patterns may remain greater than the number of sacrificial patterns that the OPC system may be capable of considering due to runtime, processing, and memory limitations. Furthermore, the optimum sacrificial patterns may have varying impact on the correction of the layer patterns. Therefore, it may be beneficial to define the optimum sacrificial patterns that have an impact that is greater than a specified threshold.

After the final virtual OPC target patterns have been defined in block 410, an OPC process may be executed to perform a correction of the layer patterns (block 415). Since the OPC process makes use of the final virtual OPC target patterns which were defined after a repetitive process to select optimum sacrificial patterns, the OPC process may effectively become a process-window aware OPC (PW-OPC) process in terms of sacrificial edge locations. However, it may be possible to execute a PW-OPC process on target edges, and so forth.

Figure 4B:
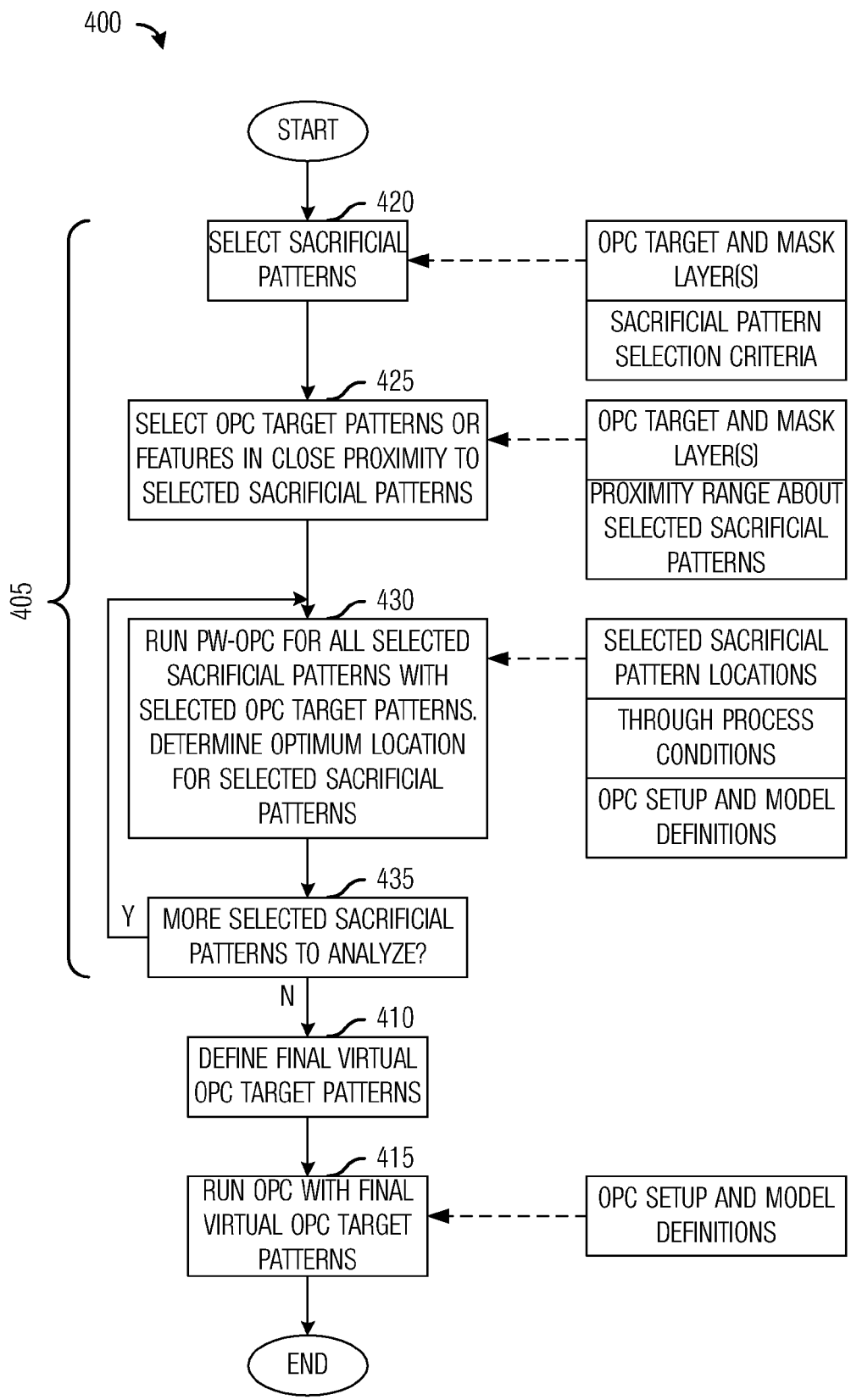
FIG. 4b is a diagram of a sequence of events in the correction of layer patterns with a detailed view of a selection of optimum sacrificial patterns.

FIG. 4b illustrates the sequence of events 400 in the correction of layer patterns with an OPC system utilizing sacrificial patterns, providing a detailed view of the selection of optimum sacrificial patterns (block 405). The selection of the optimum sacrificial patterns may include a selection of sacrificial patterns on a mask layer(s) (block 420). The sacrificial patterns may include edges and fragments of edges on the mask layer. As discussed previously, the sacrificial patterns may be patterns that may be present on a wafer after one or more exposures of a mask layer but will not be present after all exposures of all mask layers. The selection of the sacrificial patterns may have as input OPC target layer(s) as well as the mask layer(s).

After the sacrificial patterns on a mask layer(s) have been selected, then the process may continue with a selection of OPC target patterns (block 425). The OPC target patterns may include edges and/or features, that are within a specified vicinity of the selected sacrificial patterns on the mask layer(s). The selection of the OPC target patterns may have as input OPC target layer(s), mask layer(s), and the specified vicinity about the selected sacrificial patterns.

After the selection of the OPC target patterns (block 425) and the sacrificial patterns (block 420), a PW-OPC for each selected sacrificial pattern utilizing the selected OPC target pattern may be executed (block 430). The PW-OPC execution may produce as output optimum locations of the selected sacrificial patterns, producing a virtual target. Since there may be multiple selected sacrificial patterns and if they are separated by more than the specified vicinity, it may be possible to distribute the execution of the PW-OPC across multiple processors to help reduce runtime requirements. The execution of the PW-OPC may have as input the selected sacrificial patterns, through process conditions to be investigated, and OPC setup and model definitions. The execution of the PW-OPC (block 430) may continue as long as there are additional sacrificial patterns to analyze (block 435).

Figure 5:
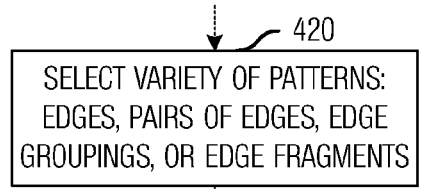
FIG. 5 is a diagram of an embodiment of a selection of a sacrificial pattern.

FIG. 5 illustrates that in addition to edges and edge fragments, the sacrificial patterns selected in the selection of sacrificial patterns on the mask layer(s) (block 420, FIG. 4b) may also include pairs of edges, pairs of edge fragments, edge groupings (more than two edges), edge fragment groupings, and so forth. A pair of edges or an edge grouping may form a feature, such as a dark or a clear region on the mask layer(s), in between the edges. The edge pairs and edge groupings may permit a modification of the dimension of the feature formed by the edges during PW-OPC for determining features that neighbor the edge pairs or edge groupings on the OPC target layers.

Figure 6:
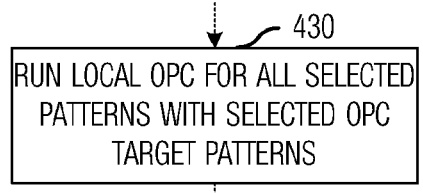
FIG. 6 is a diagram of an embodiment of an optical proximity correction process for a selected sacrificial pattern.

Rather than individually executing a PW-OPC for each selected sacrificial pattern (block 430, FIG. 4b), a local OPC may be executed for each selected sacrificial pattern, as shown in FIG. 6. The local OPC may test one or more process conditions, but not an entire range of process conditions as typically performed in PW-OPC. Additional restrictions may be added to the processing of the selected sacrificial patterns, such as permitting a selected sacrificial pattern to be moved by the local OPC, thereby using the selected sacrificial pattern's current location as an OPC target, or preventing the selected sacrificial pattern from being moved from its location. Once the local OPC processing completes for each selected sacrificial pattern, the results may be compared with a PW-OPC of the same selected sacrificial patterns and the movement of the selected sacrificial patterns that results in the largest common process window may be utilized.

Figure 7:
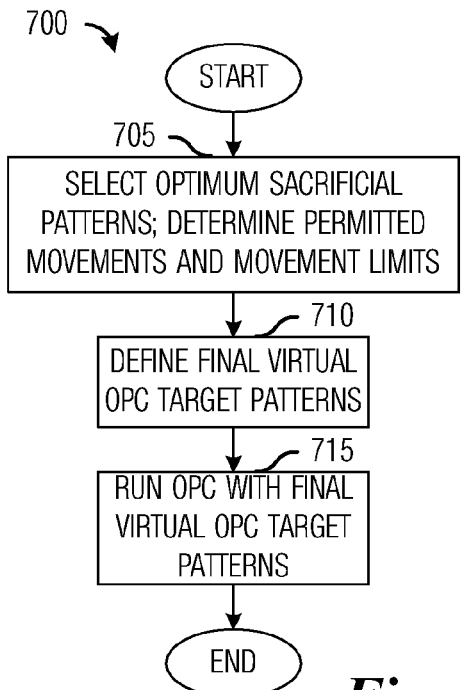
FIG. 7 is a diagram of a sequence of events in the correction of layer patterns where movements of sacrificial patterns may be limited.

In another preferred embodiment, rather than permitting movement of the selected sacrificial patterns along all possible directions, FIG. 7 illustrates a sequence of events 700 in the correction of layer patterns wherein virtual OPC targets are not defined but directions of movement as well as a maximum allowed displacement are defined. The correction of layer patterns 700 may begin with a selection of optimum sacrificial patterns (block 705). The selection of the optimum sacrificial patterns may include consideration of movement restrictions. The movement of a selected sacrificial pattern may be limited to directions that are perpendicular to the selected sacrificial pattern, for example. The movement may also be limited so that the movement is less than or equal to a maximum allowed displacement. Additionally, the movement of certain selected sacrificial patterns may even be prevented. In general, the restrictions on the direction of movement and the maximum allowed displacement may be based on specific information regarding the manufacturing process used to create the design. An output of the selection of optimum sacrificial patterns may include information such as which selected sacrificial patterns' movements have been restricted and by how much, and so forth.

Also performed in block 705 may be a definition of permitted movements. In addition to the definition of permitted movements, movement limitations, such as a maximum allowed displacement and the fixing of certain optimum sacrificial patterns may also be defined. With the definition of permitted movements and movement limits, as well as the selection of optimum sacrificial patterns (block 705), a definition of final virtual OPC target patterns may be performed (block 710). Once the final virtual OPC target patterns have been defined, a running of an OPC process may then be initiated (block 715) to complete the correction of layer patterns.

Figure 8:
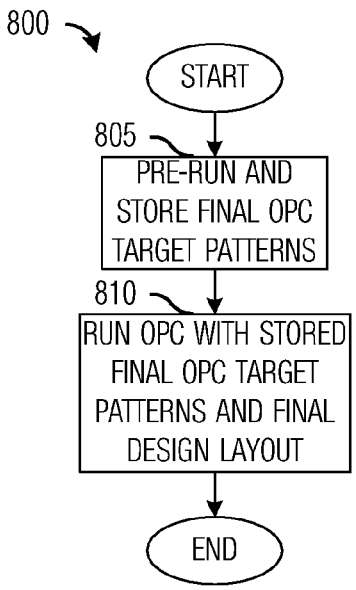
FIG. 8 is a diagram of a sequence of events in the correction of layer patterns where a simplified process model may be used.

FIG. 8 illustrates a sequence of events 800 in the correction of layer patterns with an OPC system utilizing sacrificial patterns. It may be possible to use simplified process models to investigate the impact on the process window of neighboring OPC pattern features. For example, aerial images of a design may be used to allow a pre-processing of the data and pre-define virtual OPC patterns, as well as storing final virtual OPC patterns (block 805) prior to running an OPC using the stored final virtual OPC patterns and final design layout (block 810). This may result in a savings in the runtime, processing, and memory requirements when the design layout may already be available but the actual process models may not be available.

Although the embodiments and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a mask, the method comprising:
    selecting sacrificial patterns, wherein the sacrificial patterns if exposed form a distinguishable pattern on a substrate after exposure of a subset of mask patterns but are not distinguishable after exposure of all mask patterns;
    defining virtual targets from the sacrificial patterns;
    executing an optical proximity correction process with the virtual targets to correct layer patterns; and
    forming a mask based on the corrected layer patterns.

2. The method of claim 1, wherein the executing makes use of a process model of a manufacturing process used to fabricate the semiconductor device.

3. The method of claim 1, wherein the selecting comprises:
    selecting sacrificial structures in a mask layer of a pattern for creating a semiconductor device;
    selecting target patterns in a target layer of the pattern, wherein each target pattern is less than a specified distance from a respective sacrificial structure;
    executing an optical proximity correction process for the selected sacrificial structures to determine a location for each sacrificial structure; and
    selecting the sacrificial patterns from the sacrificial structures based on results of the executing.

4. The method of claim 3, wherein the executing defines virtual patterns from the sacrificial structures.

5. The method of claim 4, further comprising, after the executing, defining virtual patterns from sacrificial structures that affect a process window of an associated target pattern by an amount exceeding a specified threshold.

6. The method of claim 3, wherein a sacrificial structure is selected from the group consisting of: edges, pairs of edges, edge groupings, fragments of edges, pairs of fragments of edges, and combinations thereof.

7. The method of claim 3, wherein an optical proximity correction process is executed for each sacrificial structure.

8. The method of claim 3, wherein the executing further comprises determining a direction of movement for the sacrificial structures.

9. The method of claim 8, wherein the executing further comprises determining a maximum allowed displacement for the sacrificial structures.

10. The method of claim 3, wherein the mask layer and the target layer comprise a top view of the semiconductor device, and the method further comprising, after the selecting of the target patterns, storing the sacrificial structures and the target patterns.

11. The method of claim 3, wherein the executing is repeated for each selected sacrificial structure.

12. The method of claim 3, wherein the optical proximity correction process comprises a local optical proximity correction process configured to adjust a sacrificial structure in a single dimension.

13. The method of claim 12, wherein the local optical proximity correction process for a single sacrificial structure is repeated multiple times with different adjustments to the sacrificial structure along the single dimension, and an adjustment that has a maximum impact on a corresponding target pattern is selected as a sacrificial pattern.

14. The method of claim 1, wherein the optical proximity correction process comprises a process window optical proximity correction process.

15. The method of claim 1, wherein the selecting of the sacrificial structures is based on mask layer pattern selection criteria.

16. A computer-related method for correcting layer patterns, the method comprising:
    in a processor, selecting optimum sacrificial patterns, wherein the sacrificial patterns if exposed form a distinguishable pattern on a substrate after exposure of a subset of mask patterns but are not distinguishable after exposure of all mask patterns;
    in the processor, defining virtual targets from the sacrificial patterns; and
    in the processor, executing an optical proximity correction process with the virtual targets to correct layer patterns.

17. A method of forming a semiconductor device, the method comprising:
    providing a mask formed by:
        selecting sacrificial patterns, wherein the sacrificial patterns if exposed form a distinguishable pattern on a substrate after exposure of the mask, but are not distinguishable after exposure of all mask patterns needed to form a resist pattern,
        defining virtual targets from the sacrificial patterns,
        executing an optical proximity correction process with the virtual targets to correct layer patterns, and
        the mask being based on the corrected layer patterns;
    forming a resist pattern on the semiconductor device by using the mask in a multiple exposure process; and
    altering a surface of the semiconductor device in a pattern based on the resist pattern.

18. The method of claim 17, wherein the selecting comprises:
    selecting sacrificial structures in a mask layer for forming the mask;
    selecting target patterns in a target layer of the resist pattern, wherein each target pattern is less than a specified distance from a respective sacrificial structure;
    executing an optical proximity correction process for the selected sacrificial structures to determine a location for each sacrificial structure; and selecting the sacrificial patterns from the sacrificial structures based on results of the executing.

19. The method of claim 17, wherein forming a resist pattern comprises:

depositing a photo resist layer on a semiconductor substrate;

exposing the photo resist layer by using the mask in a first exposure process; and exposing the photo resist layer by using a block mask in a second exposure process.

* * * * *